(12) United States Patent
Arana et al.

(10) Patent No.: US 7,243,833 B2
(45) Date of Patent: Jul. 17, 2007

(54) ELECTRICALLY-ISOLATED INTERCONNECTS AND SEAL RINGS IN PACKAGES USING A SOLDER PREFORM

(75) Inventors: Leonel R. Arana, Phoenix, AZ (US); John Heck, Berkeley, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/174,409

(22) Filed: Jun. 30, 2005

(65) Prior Publication Data

US 2007/0000976 A1    Jan. 4, 2007

(51) Int. Cl.
*B23K 35/12*    (2006.01)
*B23K 31/02*    (2006.01)

(52) U.S. Cl. .................. 228/246; 228/124.6; 257/678; 438/106

(58) Field of Classification Search ............... 228/246, 228/124.6; 257/678; 438/106
See application file for complete search history.

(56) References Cited

U.S. PATENT DOCUMENTS

| | | | | |
|---|---|---|---|---|
| 5,242,097 A | * | 9/1993 | Socha | 228/56.3 |
| 5,820,014 A | * | 10/1998 | Dozier et al. | 228/56.3 |
| 6,046,074 A | * | 4/2000 | McHerron et al. | 438/119 |
| 6,479,320 B1 | * | 11/2002 | Gooch | 438/109 |
| 6,673,697 B2 | | 1/2004 | Ma et al. | 438/455 |
| 6,713,314 B2 | | 3/2004 | Wong et al. | 438/25 |
| 6,821,032 B2 | | 11/2004 | Lake et al. | 385/94 |
| 6,850,133 B2 | | 2/2005 | Ma et al. | 335/78 |
| 6,852,926 B2 | | 2/2005 | Ma et al. | 174/52.2 |
| 6,894,383 B2 | | 5/2005 | Bar-Sadeh et al. | 257/704 |
| 6,903,452 B2 | | 6/2005 | Ma et al. | 257/680 |
| 6,943,419 B2 | | 9/2005 | Wong et al. | 257/416 |

(Continued)

OTHER PUBLICATIONS

Schimert et al., "Low Cost, Low Power Uncooled 120+160 a-Si-based Micro Infrared Camera for Law Enforcement Applications," Proceedings of SPIE vol. 4232 (2001) pp. 187-194.

(Continued)

*Primary Examiner*—Jonathan Johnson
*Assistant Examiner*—Rachel E. Beveridge
(74) *Attorney, Agent, or Firm*—Konrad Raynes & Victor, LLP; Alan S. Raynes (57) ABSTRACT

Embodiments include electronic assemblies and methods for forming electronic assemblies. One embodiment includes a method of forming a MEMS device assembly, including forming an active MEMS region on a substrate. A plurality of bonding pads electrically coupled to the active MEMS region are formed. A seal ring wetting layer is also formed on the substrate, the seal ring wetting layer surrounding the active MEMS region. A single piece solder preform is positioned on the bonding pads and on the seal ring wetting layer, the single piece solder preform including a seal ring region and a bonding pad region. The seal ring region is connected to the bonding pad region by a plurality of solder bridges. The method also includes heating the single piece solder preform to a temperature above the reflow temperature, so that the bridges split and the solder from the preform accumulates on the seal ring wetting layer and the bonding pads. A lid is coupled to the solder. In certain embodiments the lid may include vias having conductive material therein for providing electrical contact to the MEMS device.

19 Claims, 5 Drawing Sheets

U.S. PATENT DOCUMENTS

| | | | |
|---|---|---|---|
| 7,061,099 B2 | 6/2006 | Lu et al. | 257/704 |
| 7,065,867 B2 * | 6/2006 | Kim et al. | 29/841 |
| 2002/0000646 A1 * | 1/2002 | Gooch et al. | 257/666 |
| 2003/0104651 A1 * | 6/2003 | Kim et al. | 438/106 |
| 2004/0104460 A1 * | 6/2004 | Stark | 257/678 |
| 2005/0173812 A1 * | 8/2005 | Morgenstern et al. | 257/787 |
| 2005/0178820 A1 * | 8/2005 | Morgenstern et al. | 228/246 |
| 2005/0275079 A1 * | 12/2005 | Stark | 257/680 |
| 2006/0157274 A1 * | 7/2006 | Stark | 174/564 |

OTHER PUBLICATIONS

Rao, "MEMS: Expanding Functionally with Miniature Silicon Devices," Intel® DeveloperUPDATEMagazine, Apr. 2002, pp. 1-5.

Rao, "A review of the current status, scope and future trends for MEMS technologies," presentation slides from the 21st International Battery Seminar and Exhibit, Mar. 10, 2004, pp. 1-24.

Rao, "MEMS Micromechanical Systems, Expanding Moore's Law with Miniature Silicon Devices," Intel® White Paper, Apr. 2002 (4 pages).

* cited by examiner

ELECTRICALLY-ISOLATED INTERCONNECTS AND SEAL RINGS IN PACKAGES USING A SOLDER PREFORM

RELATED ART

Electronic devices such as micro electro mechanical systems (MEMS) may include a region that is covered by a lid. In certain applications, the lid should be sealed over the wafer or die, for example, over the active MEMS components. To facilitate the coupling of the lid, a solder preform may be placed on the wafer or die around the active MEMS components. The lid is then placed on the solder preform, and the stack is compressed and heated above the solder reflow temperature to solder the lid to the wafer or die. Electrical connections to the active MEMS components are made by leads positioned under the preform, with an insulating material separating the lead from the preform to prevent shorting. Such conventional processes for forming electrical connections and for attaching lids to devices such as MEMS may limit the ability to increase device integration and decrease device size.

BRIEF DESCRIPTION OF THE DRAWINGS

Embodiments are described by way of example, with reference to the accompanying drawings, which are not drawn to scale, wherein.

DETAILED DESCRIPTION

Solder preforms may be used for the attachment of covers to electronic assemblies. One such use is for the attachment of lids to MEMS devices, where the solder preform is used as a seal ring to attach the lid. However, as described above, as device integration increases and device size decreases, the conventional structure has problems due to the positioning of the leads for electrical contact to the active device region. Such leads are positioned under the seal ring solder preform, which necessitates the use of insulating materials to electrically isolate the leads from the solder preform. Certain embodiments relate to devices and methods for permitting greater device integration and decreased device size, using a single solder preform that is used for both forming a seal ring and for electrically contact to the active device region.

FIGS. 1–5 illustrate various components of an assembly that includes a wafer with a MEMS active region thereon. It should be appreciated that the term "MEMS device" as used herein includes a device including one or more of a variety of MEMS structures, including, but not limited to, micro mechanical transducers, micro optical transducers, micro optical electro mechanical systems (MOEMS), micro ionizing radiation transducers, micro thermal transducers, micro magnetic transducers, micro electro magnetic transducers, micro chemical transducers, micro biological transducers, micro fluidic devices, and micro electro mechanical switches and filters. Such MEMS devices may also be known as micromachines in Japan and may be known as microsystems in Europe. Certain embodiments may also include other types of electronic device structures including those that utilize a cavity or open region having a cover positioned thereon.

Figures 1A, 1B:
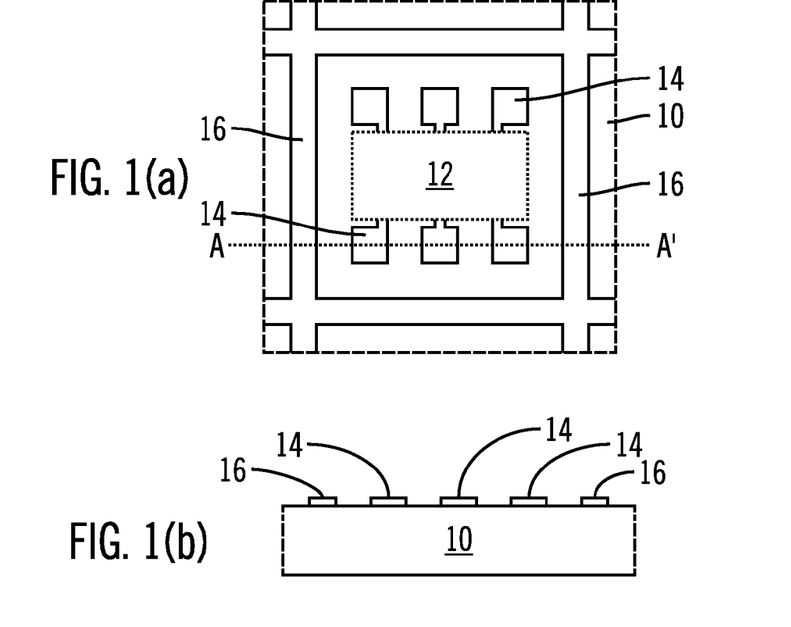
FIG. 1(a) illustrates a top view of a MEMS active region on a wafer, including bonding pads and a seal ring wetting surface in accordance with certain embodiments.
FIG. 1(b) illustrates a cross-sectional side view along line A–A' of FIG. 1(a), in accordance with certain embodiments.

FIG. 1(a) illustrates a top view of a wafer 10 having a MEMS active region 12 (bounded by dotted lines) thereon. Bonding pads 14 are electrically coupled to the MEMS active region 12. As seen in FIG. 1(a), the assembly includes six bonding pads 14, although any number of bonding pads is possible. A seal ring wetting layer 16 is positioned on the wafer 10. The seal ring wetting layer 16 may be formed from a material such as a metal (for example, gold) or alloy (for example, a nickel/gold alloy) that can bond to both the surface of the wafer 10 (which may in certain embodiments be silicon) and to a solder preform to be used as a seal ring. In certain embodiments the wetting surface region and the bonding pads may be formed from the same material and formed during the same processing operation.

The hatched lines at the periphery of FIG. 1(a) are present to indicate that the structure may in certain embodiments be extended (and repeated) on or over other portions (not shown) of the wafer surface.

FIG. 1(b) illustrates a side cross-sectional view along the line A–A' in FIG. 1(a). The cross-sectional view shows the position of the bonding pads 14 and the seal ring wetting layer 16 on the surface of the wafer 10.

Figures 2A, 2B:
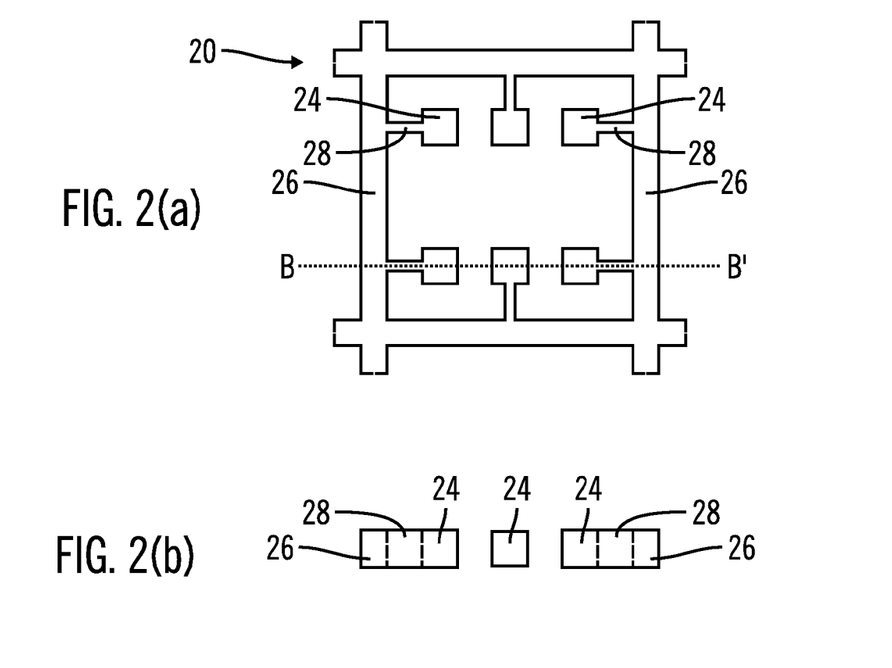
FIG. 2(a) illustrates a solder preform for use with the assembly shown in FIGS. 1(a) and 1(b), in accordance with certain embodiments.
FIG. 2(b) illustrates a cross-sectional side view along line B–B' of FIG. 2(a), in accordance with certain embodiments.

FIG. 2(a) illustrates a top view of a solder preform 20 that may be used with the structure of FIG. 1. The solder preform 20 is preferably a single piece of solder that contains metal (solder) in the relative positions of the seal ring wetting surface region 16 and bonding pads 14 of FIG. 1. As seen in FIG. 2(a), the solder preform 20 includes a seal ring portion 26 and a bonding pad interconnect portion 24. The bonding pad interconnect portion 24 includes solder preferably having similar length and width dimensions as the bonding pads 14. The seal ring portion 26 extends around the bonding pad interconnect portion 24 and preferably has similar length and width dimensions as the seal ring wetting layer 16. The solder preform 20 also includes bridges 28 that act to couple the seal ring portion 26 to the bonding pad interconnect portion 24.

FIG. 2(b) illustrates a side cross-sectional view of the solder preform 20 of FIG. 2(a) along the line B–B'. The cross-sectional view shows the solder preform 20 with various regions separated by hatched lines. The various regions of the solder preform shown in FIG. 2(b) include the seal ring portion 26, the bonding pad interconnect portion 24, and the bridge portion 28 that connects the seal ring portion 26 and the bonding pad interconnect portion 24.

The structure of the solder preform 20, including the bridges 28, acts to permit the same solder preform to be used for both forming a seal ring and for forming electrical interconnects to the bonding pads 14. Due to the properties of the solder, during the reflow process, the solder bridges 28 will break and the solder will accumulate only in the wettable areas, which includes the seal ring wetting layer 16 and the bonding pad region 14.

The solder preform may be formed from a variety of solder materials, and may include a flux if necessary. For example, certain embodiments may utilize a gold-tin solder. One such embodiment includes 80 wt % Au and 20 wt % Sn.

Figure 3A:
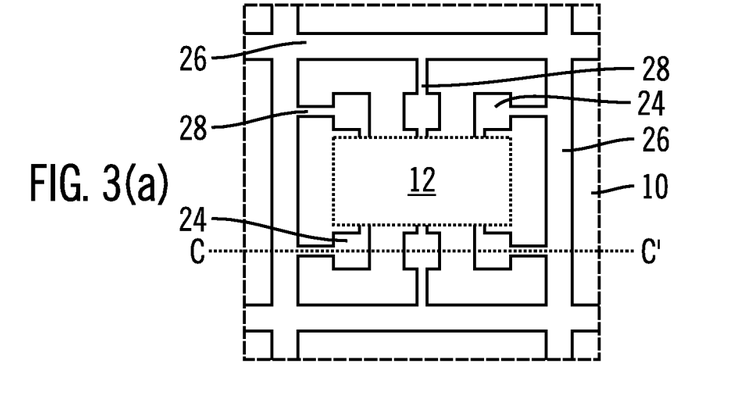
FIG. 3(a) illustrates the solder preform of FIGS. 2(a) and 2(b) positioned on the assembly shown in FIGS. 1(a) and 1(b), in accordance with certain embodiments.

FIG. 3(a) illustrates the solder preform 20 from FIG. 2 placed on the assembly of FIG. 1. The bonding pad interconnect portion 24 is positioned in alignment with the bonding pad region 14 and the seal ring portion 26 is positioned is alignment with the seal ring wetting layer 16. Alignment need not necessarily be absolutely precise, because the solder will self-align to some extent during the reflow operation.

Figure 3B:
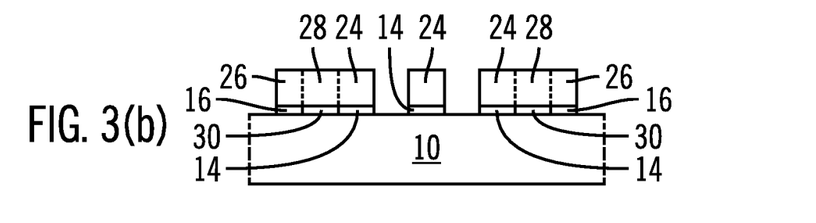
FIG. 3(b) illustrates a cross-sectional side view along line C–C' of FIG. 3(a), in accordance with certain embodiments.

FIG. 3(b) illustrates a side cross-sectional view along the line C–C' in FIG. 3(a). The cross-sectional view shows the position of the bonding pad interconnect portion 24 on each of the bonding pads 14 and the seal ring portion 26 on the seal ring wetting layer 16 on the surface of the wafer 10. The bridges 28 extend from the seal ring portion 26 to the bonding pad interconnect portion 24, leaving a gap 30 under the bridges 28 between the seal ring wetting layer 16 and the bonding pads 14.

Figure 4A:
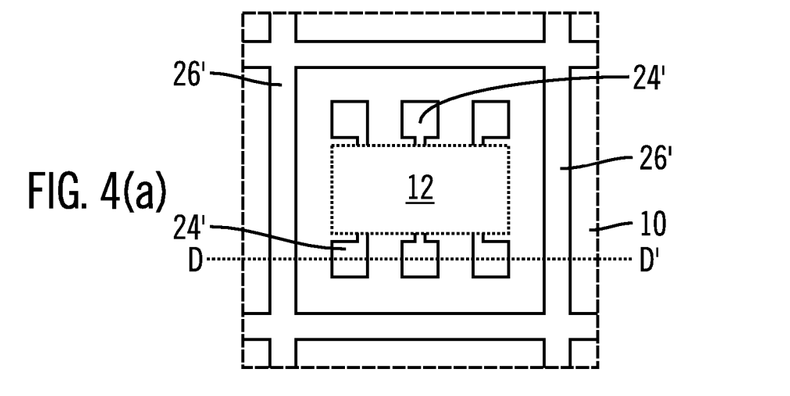
FIG. 4(a) illustrates the assembly of FIGS. 3(a) and 3(b) after a solder reflow, in accordance with certain embodiments.

FIG. 4(a) illustrates the assembly of FIGS. 3(a) and 3(b) after a first reflow operation, in which the solder is heated to a temperature just above its reflow temperature (for example, greater than about 280° C. for an 80Au-20Sn solder). Due to the relatively high surface tension of the molten solder (for example, greater than 450 dynes/cm), and the tendency for solders to only stick to materials such as metals with clean surfaces, the molten solder will only wet the metallized surface (the bonding pads 14 and the seal ring wetting surface region 16), and the bridges 28 that were holding the solder preform 20 together will split, with the solder accumulating on the seal ring wetting layer 16 and on the bonding pads 14, forming the seal ring 26' and the bonding pad interconnects 14' shown in FIG. 3(a). The non-metallized surface (for example, on the wafer 10 surface in the gap 30 of FIG. 3(b)) will be free of solder.

Figure 4B:
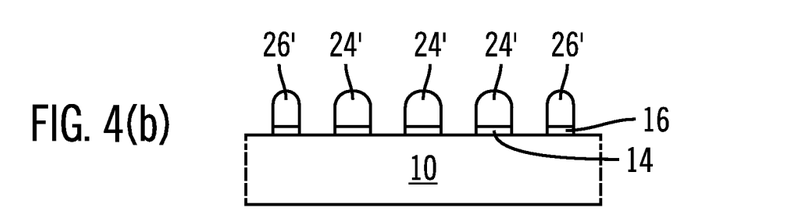
FIG. 4(b) illustrates a cross-sectional side view along line D–D' of FIG. 4(a), in accordance with certain embodiments.

FIG. 4(b) illustrates a side cross-sectional view along the line D–D' in FIG. 4(a). As seen in FIG. 4(b), the seal ring 26' and the bonding pad interconnects 24' are in the form of solder bumps that are electrically isolated from one another (except for certain connections to the active MEMS area 12, which may be electrically connected to each other).

Figure 5A:
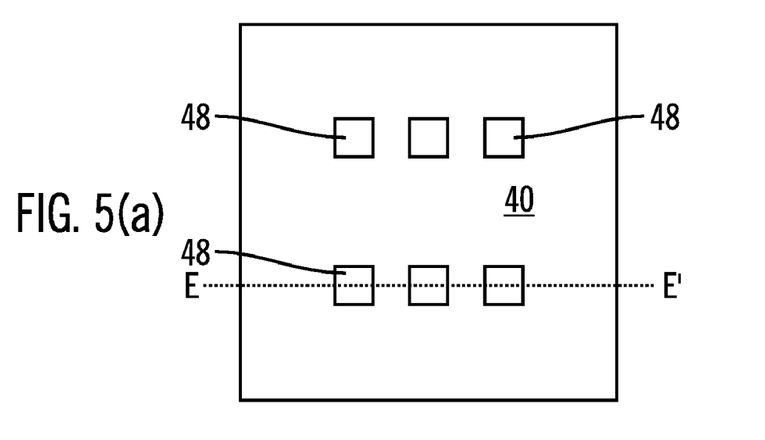
FIG. 5(a) illustrates an assembly including a lid having conductive through-vias in accordance with certain embodiments.

FIG. 5(a) illustrates a top view of the assembly of FIGS. 4(a) and 4(b) including a cover or lid 40 positioned on the seal ring 26' and bonding pad interconnects 24'. The cover 40 may in certain embodiments be formed from an electrically insulating material, and may include a plurality of conductive vias 42 (vias having conductive material therein) extending through the thickness of the cover 40, with electrically conductive pads 48 on the surface of the cover 40 in electrical contact with the conductive vias 42. For example, in certain embodiments requiring a hermetic seal, a glass ceramic material may be used for the cover 40. In certain embodiments that do not require a hermetic seal, a polymer material may be used for the cover 40. A variety of other materials may also be used.

Figure 5B:
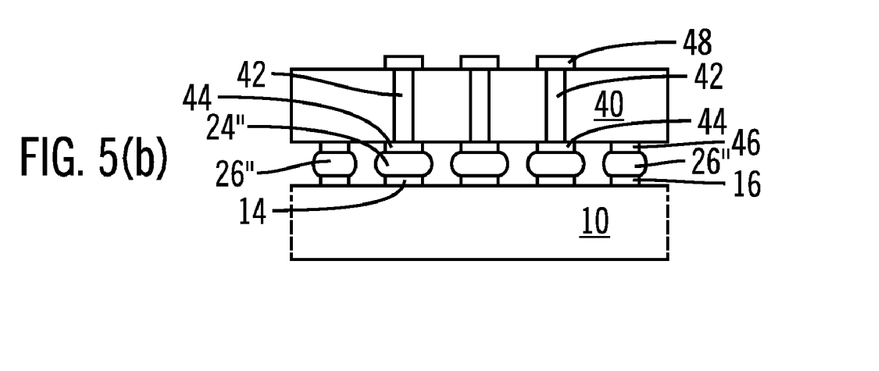
FIG. 5(b) illustrates a cross-sectional side view along line E–E' of FIG. 5(a), in accordance with certain embodiments.

FIG. 5(b) illustrates a side cross-sectional view along the line E–E' in FIG. 5(a). A wetting layer 46 is positioned between the cover 40 and the seal ring 26' and between the cover 40 and the bonding pad interconnects 24'. The wetting layer 46 may in certain embodiments be formed the same material as the layers 16 and 14 discussed above. The electrically conductive pad may in certain embodiments also be formed from the same material as the wetting layer 46 and the layers 16 and 14. As seen in FIG. 5(b), the lid 40 is pressed against the seal ring 26' and the bonding pad interconnects 24' and then a second reflow operation is conducted to bond the lid 40 to the assembly. In this embodiment, electrical access to the active area of the MEMS device is made through the cover 40.

Certain embodiments including that shown in FIGS. 5(a) and 5(b) may provide one or more of the following advantages over conventional assemblies. For example, by making electrical connections through the lid instead of from the side of the assembly, the assembly can be narrower in width. In addition, the assembly shown in FIGS. 5(a) and 5(b) does not route the connections under the seal ring and, as a result, no insulating material is needed between the connections and the seal ring. As a result, the assembly can be made thinner in height. Thus, certain embodiments enable a higher interconnect density and smaller device footprint. In addition, the number of process operations may be decreased because no deposition of insulating material operation is needed. Moreover, the use of solder preforms instead of other solder deposition operations may lead to simplified fabrication, cost savings, tight composition control, and flexibility in the solder composition used.

The embodiments described above and in connection with FIGS. 1–5 may include a number of variations. For example, the cover may be coupled to the preform in a first reflow operation and then the cover and preform and may be coupled to the MEMS wafer in a second reflow operation. Certain embodiments may have a fully enclosed active MEMS area, whereas other embodiments may have one or more openings into the active MEMS area. Embodiments may also include one or more MEMS devices forming on a wafer and then coupled to another substrate, which then has a cover attached thereto using a method such as those described herein.

Figure 6:
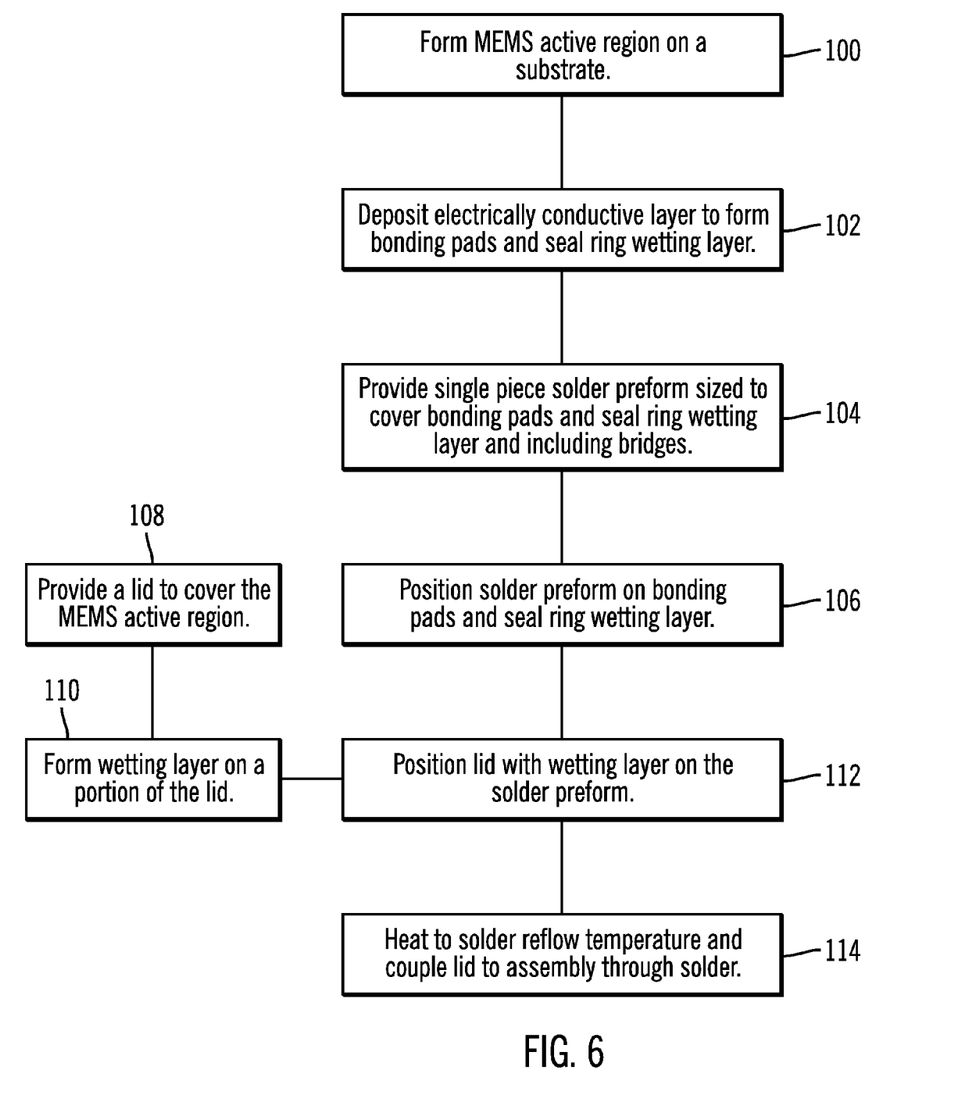
FIG. 6 illustrates a flow chart for a manufacturing method in accordance with certain embodiments.

FIG. 6 illustrates a flow chart of a method of manufacturing an assembly in accordance with certain embodiments. Box 100 is forming a MEMS active region on a wafer. Box 102 is depositing an electrically conductive layer to form bonding pads in electrical contact with the MEMS active region and to form a seal ring wetting layer on the surface of the wafer. Box 104 is providing a single piece solder preform including portions that are sized to cover at least part of the bonding pads and the seal ring wetting layer. The solder preform of Box 104 also includes bridging regions connecting the portion that is sized to cover the bonding pads with the portion that is sized to cover the seal ring wetting layer. Box 106 is positioning the single piece solder preform on the bonding pads and the seal ring wetting layer on the wafer. Box 108 is providing a lid adapted to cover the MEMS active region. Box 110 is forming a wetting layer on a portion of the lid. Box 112 is positioning the lid so that the wetting layer regions are positioned on the solder preform on the bonding pads and the seal ring wetting layer on the wafer. Box 114 is heating the solder preform to a temperature of at least the reflow temperature of the solder and coupling the lid to the wafer though the solder of the perform. Thus, in certain embodiments, a single reflow operation may be used with the preform to couple the lid to the assembly, with the preform positioned between the wafer and the lid.

The method described in the flowchart of FIG. 6 may include a number of variations. For instance, certain embodiments may utilize two reflow operations, including a first prior to positioning the lid on the assembly, and a second after the lid is placed on the assembly. Certain embodiments may also utilize a lid having vias extending therethrough. The vias may be aligned with the solder on the bonding pads and have conducting material therein, to establish electrical connections from outside of the assembly to the MEMS active region.

Figure 7:
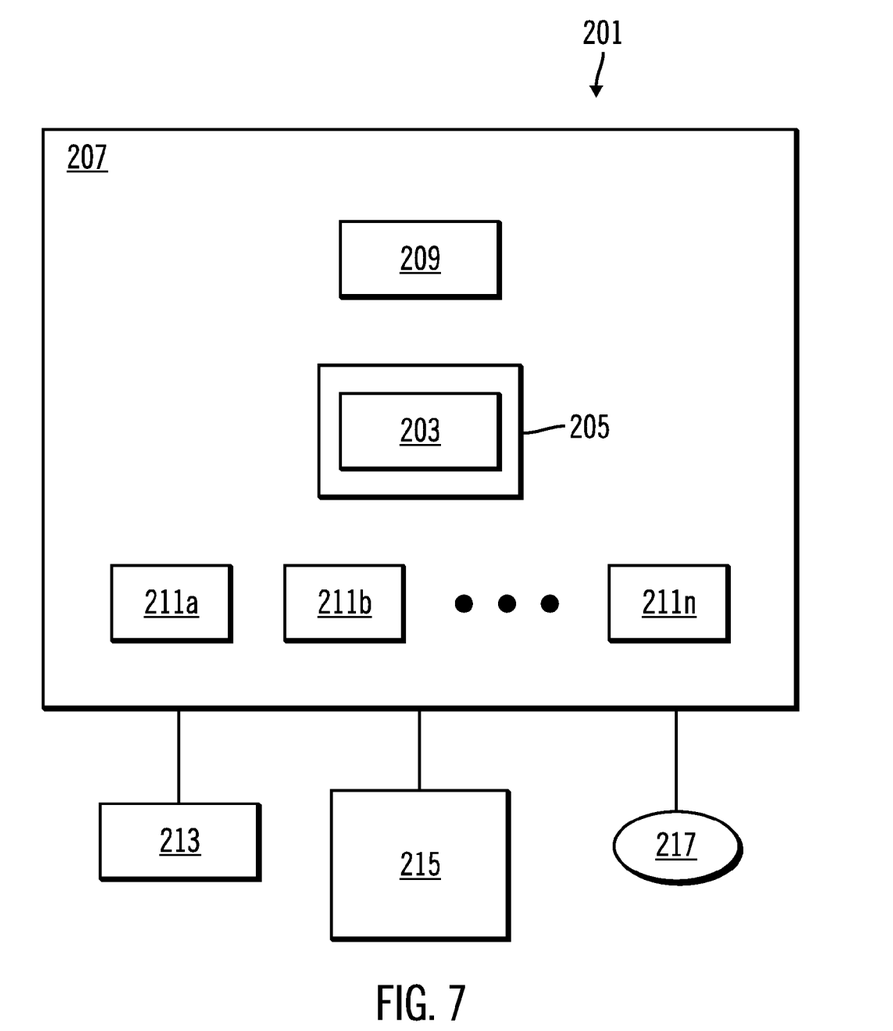
FIG. 7 illustrates one example of a computing environment in which aspects of certain embodiments may be embodied.

FIG. 7 illustrates one example of a computing environment in which aspects of described embodiments may be embodied. The computing environment includes a computer 201 including at least one central processing unit (CPU) 203. The CPU 203, also referred to as a microprocessor, may be attached to an integrated circuit package 205 having a MEMS assembly therein, which is then coupled to a printed circuit board 207, which in this embodiment, is a motherboard. The integrated circuit package 205 having a MEMS assembly is an example of an electronic assembly in accordance with the embodiments discussed above in connection with FIGS. 1–6.

The computer 201 further may further include memory 209 and one or more controllers 211a, 211b . . . 211n, which are also disposed on the motherboard 207. The motherboard 207 may be a single layer or multi-layered board which has a plurality of conductive lines that provide communication between the circuits in the package 205 and other components mounted to the board 207. Alternatively, one or more of the CPU 203, memory 209 and controllers 211a, 211b . . . 211n may be disposed on other cards such as daughter cards or expansion cards. The CPU 203, memory 209 and controllers 211a, 211b . . . 211n may each be seated in individual sockets or may be connected directly to a printed circuit board. A display 215 may also be included.

Any suitable operating system and various applications execute on the CPU 203 and reside in the memory 209. The content residing in memory 209 may be cached in accordance with known caching techniques. Programs and data in memory 209 may be swapped into storage 213 as part of memory management operations. The computer 201 may comprise any suitable computing device, such as a mainframe, server, personal computer, workstation, laptop, handheld computer, telephony device, network appliance, virtualization device, storage controller, network controller, etc.

The controllers 211a, 211b . . . 211n may include a system controller, peripheral controller, memory controller, hub controller, I/O bus controller, video controller, network controller, storage controller, etc. For example, a storage controller can control the reading of data from and the writing of data to the storage 213 in accordance with a storage protocol layer. The storage protocol of the layer may be any of a number of known storage protocols. Data being written to or read from the storage 213 may be cached in accordance with known caching techniques. A network controller can include one or more protocol layers to send and receive network packets to and from remote devices over a network 217. The network 217 may comprise a Local Area Network (LAN), the Internet, a Wide Area Network (WAN), Storage Area Network (SAN), etc. Embodiments may be configured to transmit data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed is:

1. A method of forming a MEMS device assembly, comprising:
   forming an active MEMS region on a substrate;
   forming a plurality of bonding pads electrically coupled to the active MEMS region forming a seal ring wetting layer on the substrate, the seal ring wetting layer surrounding the active MEMS region;
   positioning a single piece solder preform on the bonding pads and seal ring wetting layer, the single piece solder preform including a seal ring region and a bonding pad region, the seal ring region being connected to the bonding pad region by a plurality of solder bridges;
   heating the single piece solder preform to a temperature of at least the solder reflow temperature, so that the bridges split and the solder from the preform accumulates on the seal ring wetting layer and the bonding pads;
   cooling the solder after the heating the single piece solder perform to a temperature of at least the solder reflow temperature, wherein the solder forms a solder seal ring on the seal ring wetting layer and solder bonding pad interconnects on the bonding pads; and
   forming a wetting layer on a portion of a lid and coupling the lid to the solder, wherein the coupling the lid to the solder includes positioning the lid so that the wetting layer on the lid is positioned on the solder seal ring and on the solder bonding pad interconnects, and wherein the wetting layer on a portion of the lid is formed from the same material as the seal ring wetting layer and the bonding pads.

2. A method according to claim 1, further comprising forming the plurality of bonding pads and the seal ring wetting layer simultaneously.

3. A method according to claim 1, wherein the heating the single piece solder preform to a temperature of at least the solder reflow temperature is also used for the coupling the lid.

4. A method according to claim 1, wherein the heating the single piece solder preform to a temperature of at least the solder reflow temperature is also used for the coupling the lid.

5. A method according to claim 1, wherein the substrate and the lid are each formed from a material comprising silicon.

6. A method according to claim 1, wherein the solder preform is formed from a material comprising gold and tin.

7. A method as in claim 1, further comprising:
   providing a plurality of vias having an electrically conductive material therein extending through the lid; and
   positioning the lid so that the vias are in alignment with the solder bonding pad interconnects.

8. A method as in claim 1, wherein the heating the single piece solder preform to a temperature of at least the solder reflow temperature comprises a first reflow operation, and wherein the coupling the lid to the assembly is carried out after the first reflow operation, using a second reflow operation in which the solder is heated to a temperature of at least the solder reflow temperature to couple the lid to the solder.

9. A method for forming an assembly including an electronic device having a lid, comprising:
forming an assembly including an electronic device on a substrate;
forming a plurality of bonding pads electrically coupled to the electronic device;
forming a seal ring wetting layer on the substrate, the seal ring wetting layer surrounding the electronic device;
positioning a single piece solder preform on the bonding pads and seal ring wetting layer, the single piece solder preform including a seal ring region and a bonding pad region, the seal ring region being connected to the bonding pad region by a plurality of solder bridges;
heating the single piece solder preform to a temperature of at least the solder reflow temperature, so that the bridges split and the solder from the preform accumulates on the seal ring wetting layer to form a solder seal ring and accumulates on the bonding pads to form solder bonding pad interconnects; and
positioning a lid to cover the electronic device, and coupling the lid to the assembly;
wherein the heating the single piece solder preform to a temperature of at least the solder reflow temperature comprises a first reflow operation, and wherein the coupling the lid to the assembly is carried out after the first reflow operation, using a second reflow operation in which the solder is heated to a temperature of at least the solder reflow temperature to couple the lid to the solder.

10. A method according to claim 9, further comprising forming a wetting layer on a portion of the lid prior to the coupling the lid to the solder, and wherein the wetting layer is positioned between the lid and the solder.

11. A method according to claim 9, further comprising forming the electronic device to include a MEMS device.

12. A method as in claim 9, further comprising:
providing a plurality of vias having an electrically conductive material therein extending through the lid; and
positioning the lid so that the vias are in alignment with the solder bonding pad interconnects.

13. A method including an electronic device having a lid, comprising:
forming an assembly including an electronic device on a substrate;
forming a plurality of bonding pads electrically coupled to the electronic device;
forming a seal ring wetting layer on the substrate, the seal ring wetting layer surrounding the electronic device;
positioning a single piece solder preform on the bonding pads and seal ring wetting layer, the single piece solder preform including a seal ring region and a bonding pad region, the seal ring region being connected to the bonding pad region by a plurality of solder bridges;
heating the single piece solder preform to a temperature of at least the solder reflow temperature, so that the bridges split and the solder from the preform accumulates on the seal ring wetting layer to form a solder seal ring and accumulates on the bonding pads to form solder bonding pad interconnects; and
positioning a lid to cover the electronic device and coupling the lid to the assembly;
wherein the seal ring wetting layer and the bonding pads are formed simultaneously and from the same material.

14. A method as in claim 13, further comprising:
providing a plurality of vias having an electrically conductive material therein extending through the lid; and
positioning the lid so that the vias are in alignment with the solder bonding pad interconnects.

15. A method according to claim 13, further wherein the electronic device comprises a MEMS device.

16. A method including an electronic device having a lid, comprising:
forming an assembly including an electronic device on a substrate, the assembly including a region to be covered by a lid;
forming a plurality of bonding pads electrically coupled to the electronic device;
forming a seal ring wetting layer on the substrate, the seal ring wetting layer surrounding the electronic device;
positioning a single piece solder preform on the bonding pads and seal ring wetting layer, the single piece solder preform including a seal ring region and a bonding pad region, the seal ring region being connected to the bonding pad region by a plurality of solder bridges;
heating the single piece solder preform to a temperature of at least the solder reflow temperature, so that the bridges split and the solder from the preform accumulates on the seal ring wetting layer to form a solder seal ring and accumulates on the bonding pads to form solder bonding pad interconnects; and
forming a wetting layer on a portion of a lid and then positioning the lid to cover the electronic device and coupling the lid to the assembly;
wherein the wetting layer on a portion of the lid is formed from the same material as the seal ring wetting layer and the bonding pads.

17. A method according to claim 16, wherein the coupling the lid to the solder is carried out during the heating the single piece solder preform to a temperature of at least the reflow temperature.

18. A method as in claim 16, further comprising:
providing a plurality of vias having an electrically conductive material therein extending through the lid; and
positioning the lid so that the vias are in alignment with the solder bonding pad interconnects.

19. A method according to claim 16, further wherein the electronic device comprises a MEMS device.

* * * * *